United States Patent
Mehrad et al.

(10) Patent No.: US 6,380,031 B1
(45) Date of Patent: Apr. 30, 2002

(54) METHOD TO FORM AN EMBEDDED FLASH MEMORY CIRCUIT WITH REDUCED PROCESS STEPS

(75) Inventors: Freidoon Mehrad; Jie Xia; Sandra Zheng; Lancy Tsung, all of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 09/637,090

(22) Filed: Aug. 10, 2000

Related U.S. Application Data
(60) Provisional application No. 60/152,879, filed on Sep. 8, 1999.

(51) Int. Cl.$^7$ .............................................. H01L 21/336
(52) U.S. Cl. ...................... 438/257; 438/258; 438/316; 438/266; 438/286; 438/201; 438/211
(58) Field of Search .................................. 438/257, 258, 438/316, 266, 286, 201, 211, 317, 318, 319, 320, 321, 322

(56) References Cited

U.S. PATENT DOCUMENTS

| | | | |
|---|---|---|---|
| 5,879,990 A | * | 3/1999 | Dormans et al. ............ 438/257 |
| 6,207,991 B1 | * | 3/2001 | Rahim ......................... 438/258 |
| 6,274,430 B1 | * | 8/2001 | Jan et al. ..................... 438/258 |

FOREIGN PATENT DOCUMENTS

EP  1069614 A2 * 1/2001 ....... H01L/21/8247

* cited by examiner

*Primary Examiner*—Matthew Smith
*Assistant Examiner*—Igwe U. Anya
(74) *Attorney, Agent, or Firm*—Peter K. McLarty; W. James Brady, III; Frederick J. Telecky, Jr.

(57) ABSTRACT

A method to form an embedded FLASH integrated circuit with reduced processing steps is described. In the method a partial etch is performed on the control gate region of a polycrystalline silicon film (21). A multiple etch process is then used to simultaneously form the FLASH memory cell gate stack (54), the NMOS gate structure (94) and the PMOS gate structure (96).

11 Claims, 6 Drawing Sheets

METHOD TO FORM AN EMBEDDED FLASH MEMORY CIRCUIT WITH REDUCED PROCESS STEPS

This application claims benefit to Provisional Application 60/152,879 filed Sep. 8, 1999.

CROSS-REFERENCE TO RELATED PATENT/ PATENT APPLICATIONS

The following commonly assigned patent/patent applications are hereby incorporated herein by reference:

| Patent No./Serial No. | Filing Date | TI Case No. |
| --- | --- | --- |
|  |  | TI-29001 |
| 60/068,543 | 12/23/97 | TI-23167 |
| 60/117,774 | 1/29/99 | TI-28594 |
| 60/145 766 | 7/27/99 | TI-29184 |

FIELD OF THE INVENTION

This invention relates generally to the field of electronic devices and more particularly to a method for forming an embedded FLASH memory circuit with reduced processing steps.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

FLASH memory, also known as FLASH EPROM or FLASH EEPROM, is a semiconductor component that is formed from an array of memory cells with each cell having a floating gate transistor. Data can be written to each cell within the array, but the data is erased in blocks of cells. Each cell is a floating gate transistor having a source, drain, floating gate, and a control gate. The floating gate uses channel hot electrons for writing from the drain and uses Fowler-Nordheim tunneling for erasure from the source. The sources of each floating gate in each cell in a row of the array are connected to form a source line.

Embedding FLASH memory circuits in CMOS logic circuits (embedded FLASH) is finding increasing usage in building more complex integrated circuits such as digital signal processors for applications such as hard disk controllers.

Traditionally, in CMOS integrated circuit fabrication, the polycrystalline silicon gates of both the NMOS and PMOS transistors were doped n-type with phosphorous through diffusion or ion implantation with no additional photolithography masks. The shrinking dimensions of the transistors in current use in CMOS integrated circuits have led to the gate of the NMOS transistors being doped n-type with this dopant being blocked from entering the gates of the PMOS transistors using a photolithographic pattern and masking step. The gates of the PMOS transistors are implanted p-type during the formation of the source and drain regions of the PMOS transistors. This process results in the proper threshold voltage in both the NMOS and PMOS transistors. For embedded FLASH circuits these doping requirements for the CMOS gates results in two critical masking levels to separately define the CMOS gates and the FLASH memory gate adding high processing cost and increased processing complexity. In addition, the problems associated with etching doped and undoped polycrystalline silicon to form the CMOS gates sometimes requires the use of an additional masking step (it is known in the art that doped polycrystalline silicon films etches at a faster rate than undoped polycrystalline silicon films). There is therefore a need for a method to simultaneously form the FLASH memory gate stack and the CMOS gates that reduces the number of masking levels reducing cost and process complexity.

SUMMARY OF THE INVENTION

Accordingly, a need has arisen for a simplified process to form embedded FLASH integrated circuits. The present invention provides method that accomplishes this through a reduction in number of masking levels and improved etching processes. One method of the instant invention comprises: forming a first photoresist film over a semiconductor substrate; patterning said first photoresist film to expose a first region of a polycrystalline film where a control gate will be formed in a FLASH memory cell and masking a second region of said polycrystalline film wherein said second region of said polycrystalline silicon film region will be used to form a gate structure of a NMOS transistor and a gate structure of a PMOS transistor; and partially etching said first region of said polycrystalline film. The embodiment further comprises: removing said first photoresist film; forming and patterning a second photoresist film; and etching said polycrystalline film to simultaneously form a FLASH memory cell gate stack structure, said gate structure of said NMOS transistor and said gate structure of said PMOS transistor.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

FIGS. 1 through 5 illustrates various aspects of an electronic device and the method of forming an embedded FLASH integrated circuit with reduced processing steps.

Figure 1:
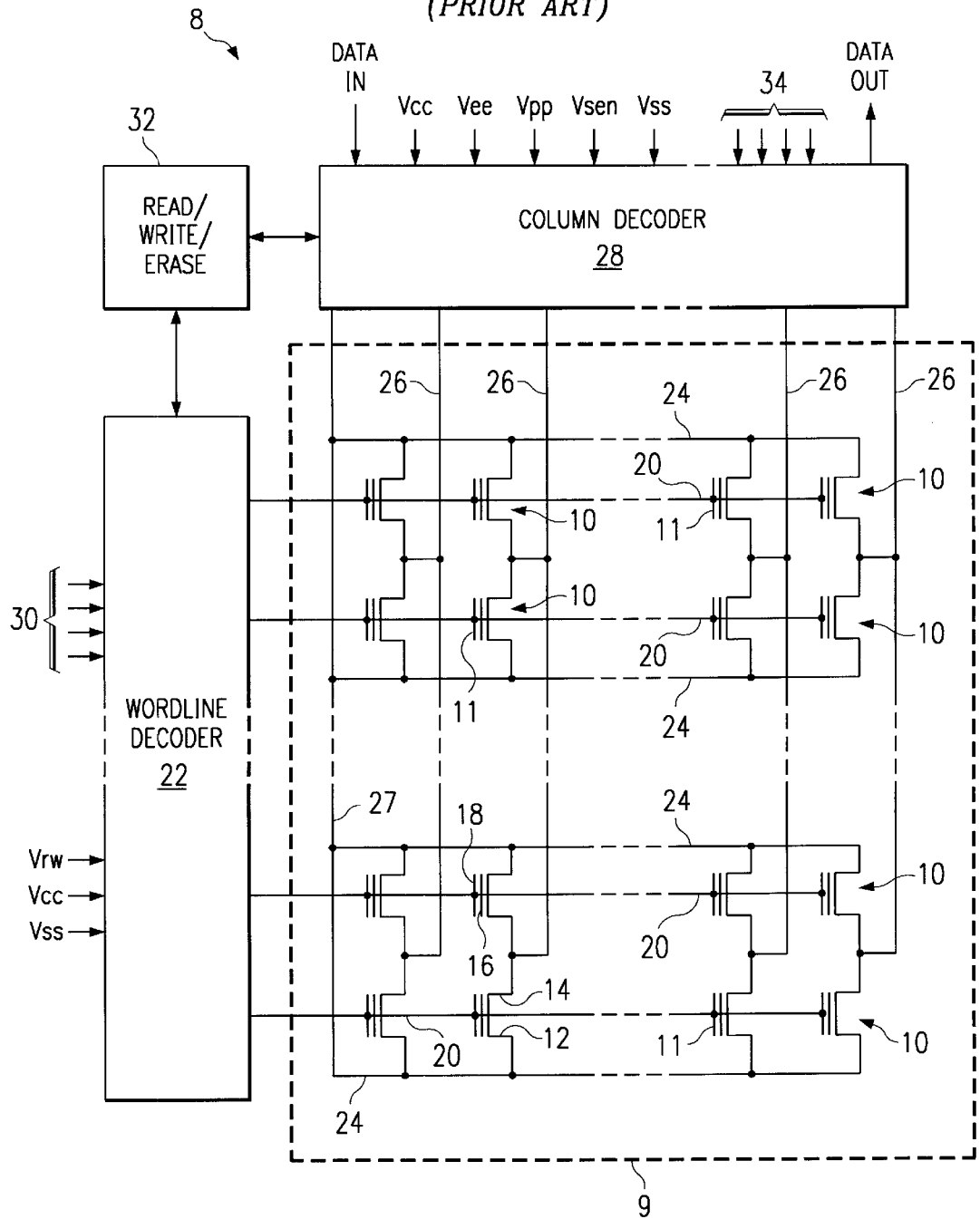
FIG. 1 is an electrical schematic diagram, in partial block diagram form, of an electronic device which includes a memory cell array in accordance with the prior art.

FIG. 1 is an electrical schematic diagram, in partial block form, of an electronic device 8 in accordance with the prior art. The electronic device 8 includes a wordline decoder 22, a column decoder 28, a Read/Write/Erase control circuit 32 for controlling the decoders 22 and 28, and a memory cell array 9. The memory cell array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28 and each of the drain-column lines 26 is coupled to the column decoder 28.

In a write or program mode, the wordline decoder 22 may function, in response to wordline address signals on lines 30 and to signals from the Read/Write/Erase control circuit 32 to place a preselected first programming voltage $V_{RW}$, approximately +12V, on a selected wordline 20, which is coupled to the control gate 18 of a selected cell 10. Column decoder 28 also functions to place a second programming voltage $V_{pp}$, approximately +5 to +10 V, on a selected drain-column line 26 and, therefore, the drain 14 of the selected cell 10. Source lines 24 are coupled to a reference potential $V_{ss}$ through line 27. All of the deselected drain-column lines 26 are coupled to the reference potential $V_{ss}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately −2V to −6V with respect to the gate region.

The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read-as "one" bits.

In a flash erase mode, the column decoder 28 functions to leave all drain-column lines 26 floating. The wordline decoder 22 functions to connect all of the word lines 20 to the reference potential $V_{ss}$. The column decoder 28 also functions to apply a high positive voltage $V_{EE}$, approximately +10V to +15 V, to all of the source lines 24. These erasing voltages create sufficient field strength across the tunneling area between floating gate 16 and the semiconductor substrate to generate a Fowler-Nordheim tunnel current that transfers charge from the floating gate 16, thereby erasing the memory cell 10.

In the read mode, the wordline decoder 22 functions, in response to wordline address signals on lines 30 and to signals from Read/Write/Erase control circuit 32, to apply a preselected positive voltage $V_{cc}$, approximately +5V, to the selected wordline 20, and to apply a low voltage, ground or $V_{ss}$, to deselected wordlines 20. The column decoder 28 functions to apply a preselected positive voltage $V_{SEN}$, approximately +1.0V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
|---|---|---|---|
| Selected Wordline | 5 V | 12 V | 0 V (All) |
| Deselected Word lines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

Figure 2:
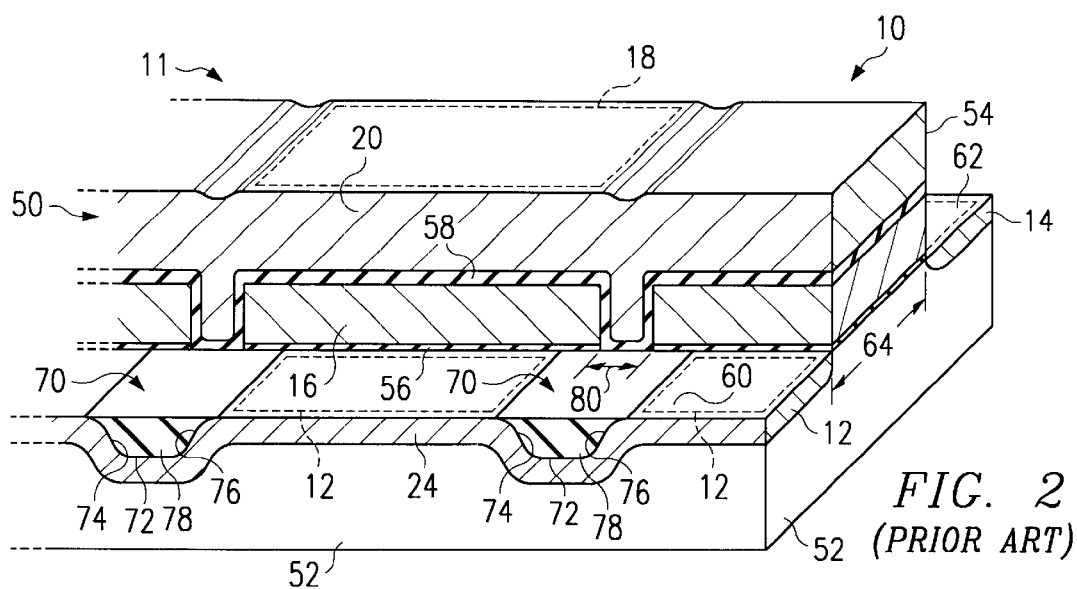
FIG. 2 is a perspective view of a portion of the memory cell array of FIG. 1.
Figure 3:
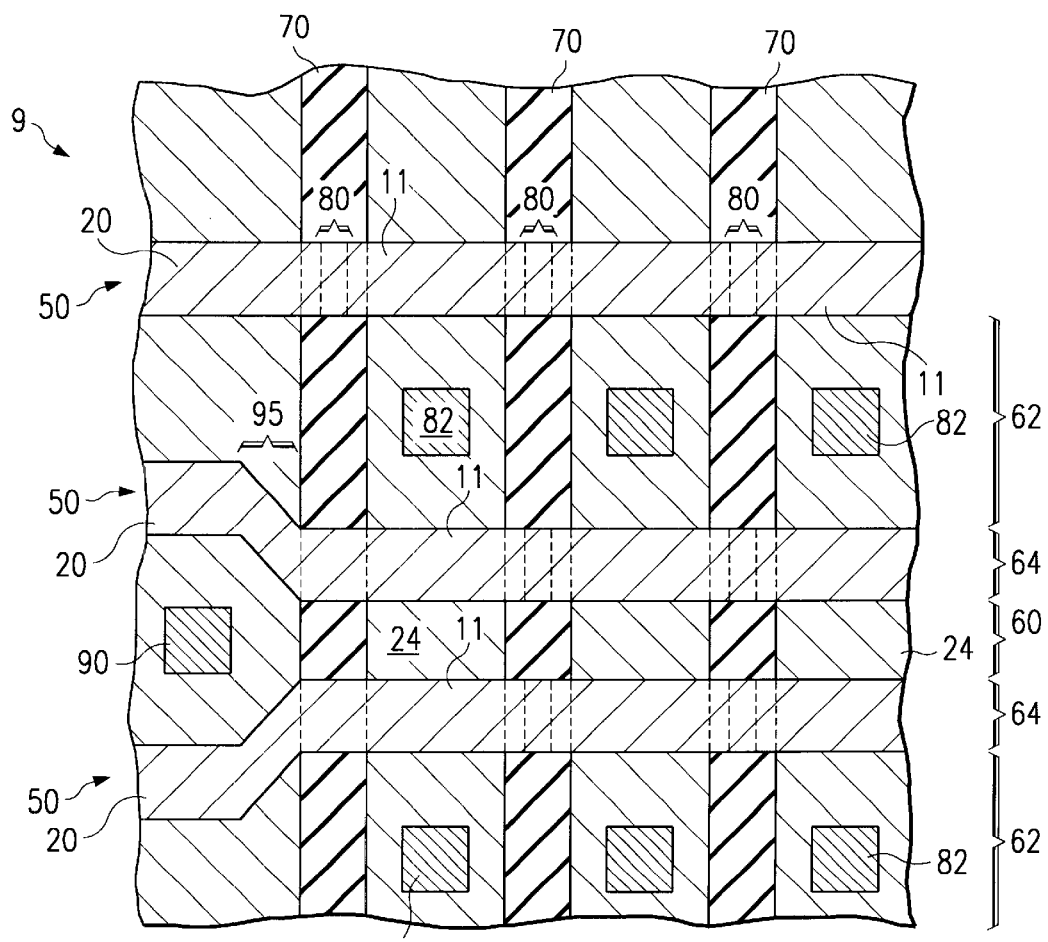
FIG. 3 is an enlarged plan view of a portion of the memory cell of FIG. 1.

FIGS. 2 and 3 illustrate the structure of a portion of the memory array 9 illustrated in FIG. 1. Specifically, FIG. 2 is a perspective view of a portion of the memory array 9 and FIG. 3 is an enlarged plan view of a portion of memory array 9. As discussed previously, the memory array 9 includes a number of memory cells 10 arranged in rows and columns.

As best illustrated in FIG. 2, each row of memory cells 10 is formed from a continuous stack structure 50 that includes a number of memory cells 10. The floating gate transistor 11 within each memory cell 10 is formed on a semiconductor substrate 52 and separated from each adjacent memory cell 10 in the continuous stack structure 50 by a shallow trench isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. The semiconductor substrate 52 may include an epitaxial layer, a recrystallized semiconductor material, a polycrystalline semiconductor material, or any other-suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 2, the floating gate transistors 11 in each continuous stack structure 50 in the memory array 9 are electrically isolated from one another by the shallow trench isolation (STI) structure 70. The STI structures 70 are generally formed prior to the fabrication of the gate stack 54 on the semiconductor substrate 52. The STI structures 70 are formed by etching a trench 72 into the semiconductor substrate 52. The trench 72 is generally on the order of 0.2 to 8.5 μm in depth. The trench 72 comprises a first sidewall surface 74 and a second sidewall surface 76.

The trench 72 is then filled with a trench dielectric material 78 to electrically isolate the active regions of the semiconductor substrate 52 between the STI structures 70. The trench dielectric material 78 may comprise silicon dioxide, silicon nitride, or a combination thereof. The trench dielectric material 78 is generally etched back, followed by a deglaze process to clean the surface of the semiconductor substrate 52 prior to fabrication of the gate stack 54.

The continuous stack structure 50 is then fabricated outwardly from the semiconductor substrate 52 and the filled trench 72. The continuous stack structure 50 is formed from a series of gate stacks 54 fabricated outwardly from the channel region 64 of the semiconductor substrate 52. As best shown in FIG. 2, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator SG. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise silicon oxide or silicon nitride on the order of 25 A to 500 A in thickness.

The floating gate 16 and the control gate 18 are conductive regions. The gates 16 and 18 generally comprise a polycrystalline silicon material (polysilicon) that is in-situ doped with impurities to render the polycrystalline silicon conductive. The thicknesses of the gates 16 and 18 are generally on the order of 100 nanometers and 300 nanometers, respectively.

The interstitial dielectric 58 may comprise oxide, nitride, or a heterostructure formed by alternating layers of oxide and nitride. The interstitial dielectric 58 is on the order of 5 to 40 nanometers in thickness.

As best illustrated in FIG. 3, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9.

In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. The floating gates 16 in adjacent memory cells 10 are isolated by a gap 80. The gap 80 is generally etched into a layer of conductive material (not shown) that is used to form the floating gate 16.

As shown in FIG. 2, the source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26 (not shown). As will be discussed in greater detail below, the source 12 of each floating gate transistor 11 forms a portion of the source line 24 and is formed during the fabrication of the source line 24.

As best illustrated in FIG. 2, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 2, the source line 24 crosses the STI structures 70 in the source region 60 of the semiconductor substrate 52 below the STI structures 70. In contrast, the STI structures 70 electrically isolate the adjacent floating gate transistors 11 in the channel region 64 of the semiconductor substrate.

The source line 24, and correspondingly the sources 12 of each floating gate transistor 11, is generally fabricated after at least a portion of the gate stack 54 has been fabricated. The gate stack 54 is pattern masked (not shown) using conventional photolithography techniques, leaving the semiconductor substrate 52, proximate the source region 60, exposed. The exposed region of the semiconductor substrate 52 is then etched to remove the trench dielectric material 78 in the exposed region. The etching process to remove the trench dielectric material 78 may be an anisotropic etching process. Anisotropic etching may be performed using a reactive ion etch (RIE) process using carbon-fluorine based gases such as $CF_4$ or $CHF_3$.

The semiconductor substrate 52 proximate the source region 60, including that portion of the semiconductor substrate 52 forming the trench 72, is doped with impurities to render the region conductive. The conductive region is then thermally treated to diffuse the impurities into the source region 60 of the semiconductor substrate 52. The diffused conductive region forms both the source 12 of each floating gate transistor 11 as well as the source line 24. The source region 60 of the semiconductor substrate 52 is generally doped by an implantation process in which dopant ions are impacted into the semiconductor substrate 52. After formation of the source line 24, and as a part of subsequent processing, the trench 72 is refilled with a dielectric material.

Figure 4:
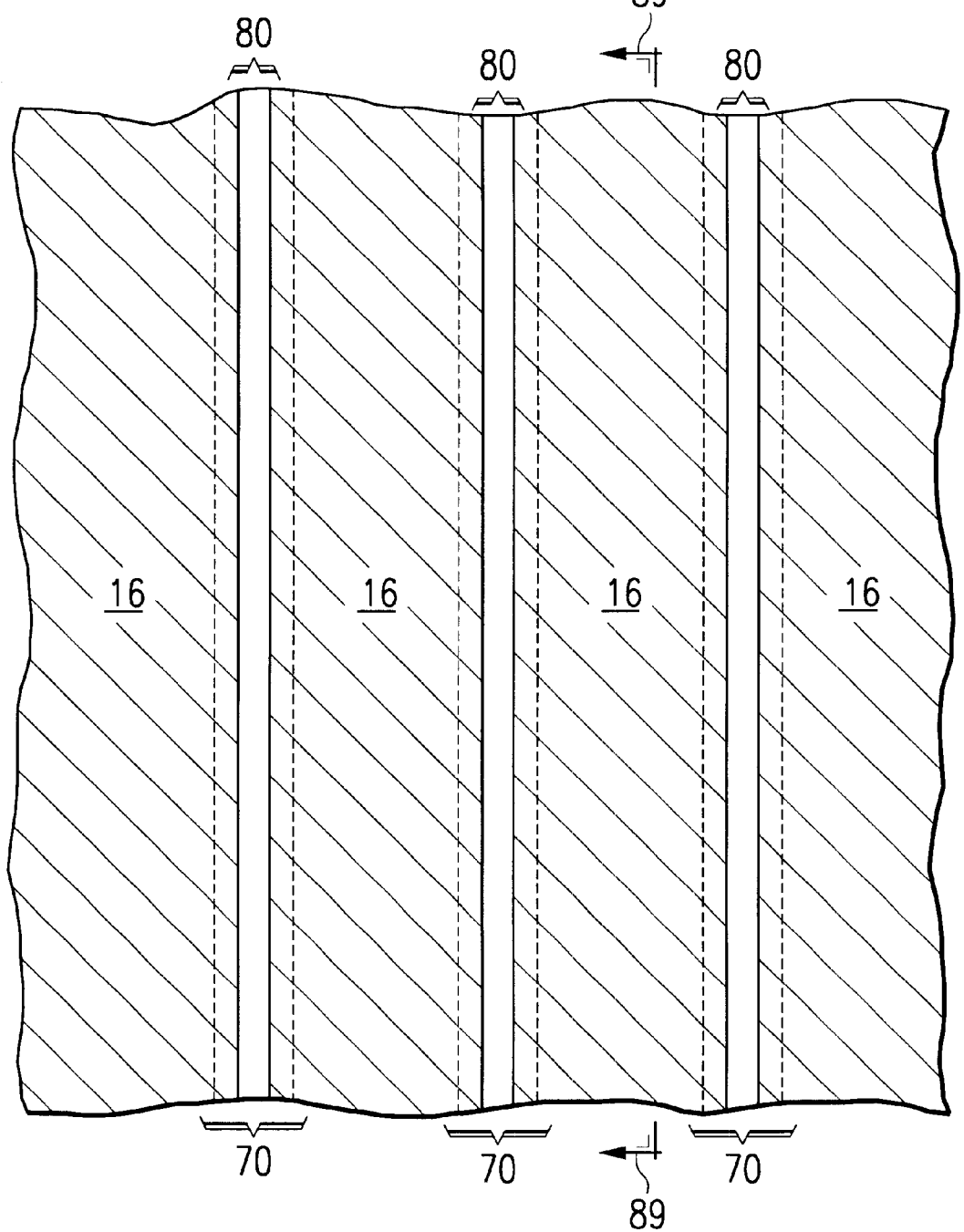
FIG. 4 is an enlarged plan view of a partially fabricated portion of the memory cell of FIG. 1.

Shown in FIG. 3 is the source line contact 90. In typical FLASH memory layout design there is one source contact for every sixteen drain contacts. Because of the spacing of the source line the word line 20 has to bend 95 around the source contact 90. In addition for high density designs, the width of the drain region 62 is larger than the width of the source region 60. This results in a non-uniform spacing of the wordlines 20. Illustrated in FIG. 4 is a top view of a portion of the FLASH memory 9 after the first polycrystalline silicon layer etch process. The polycrystalline silicon lines 16 will be further defined later in the process to form a part of the gate stack 54 of the memory cells 11. Contiguous to the FLASH memory shown in FIG. 4 is CMOS circuitry which is not shown in FIG. 4 for clarity. The FLASH memory shown in FIG. 4 is part of an embedded FLASH memory circuit.

Figure 5A:
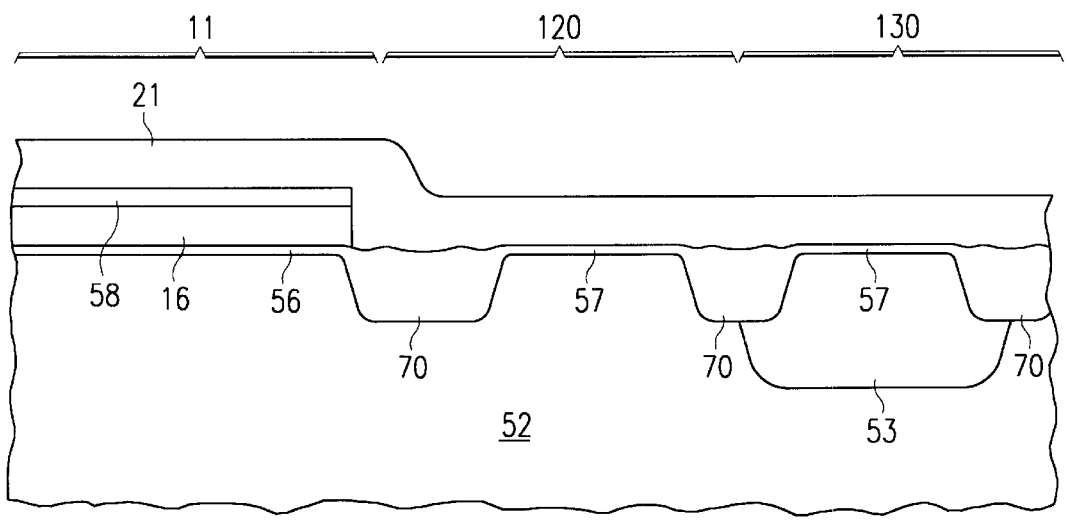
FIGS. 5A–5F are cross-sectional views of an embedded FLASH integrated circuit comprising a FLASH memory cell, a PMOS transistor and a NMOS transistor illustrating the steps on an embodiment of the instant invention.

Shown in FIG. 5A is a cross section taken through 89 in FIG. 4 showing a portion of the embedded FLASH memory circuit and a portion of the CMOS circuit on the same chip. In region 11 of FIG. 5A, a single memory cell will be formed. In region 120 a NMOS transistor will be formed and in region 130 a PMOS transistor will be formed. Although the various memory cells and CMOS transistors are shown beside each other in FIGS. 5A–5F, this is only to illustrate an embodiment of the invention and should not be considered a limitation of the instant invention. The various memory cells 11, NMOS transistors 120 and PMOS transistors 130 can be physically located anywhere on the semiconductor chip. As shown in FIG. 5A, the interstitial dielectric 58 may comprise oxide, nitride, or a heterostructure formed by alternating layers of oxide and nitride. The interstitial dielectric 58 is on the order of 5 to 40 nanometers in thickness. The interstitial dielectric is formed on the polycrystalline silicon layer 16. As discussed above, a NMOS transistor will be formed in region 120 and a PMOS transistor in region 130. In an embodiment, the substrate comprises p-type silicon 52 with regions of n-type silicon 53 in which the PMOS transistors will be formed. Both regions 52 and 53 comprise single crystal silicon either as part of a bulk substrate wafer or as an epitaxial silicon film formed on a bulk substrate wafer. Isolation regions 70 are formed in the substrate to electrically isolate the various devices which are formed as part of the integrated circuit. These isolation regions comprise silicon dioxide and will be either shallow trench isolation (STI) structures or local oxidation structures (LOCOS). The isolation structures shown in FIGS. 5A–5F are representative of STI structures. A gate dielectric film 57 is formed over the semiconductor substrate 52 which will form part of the NMOS and PMOS transistor structure. This gate dielectric can comprise silicon oxide, silicon oxynitride, silicon nitride, or any suitable material. At this point in the process, the individual gates of the PMOS and NMOS transistors have not been formed and a blanket layer of polycrystalline silicon 21 covers regions 11, 120 and 130.

Figure 5B:
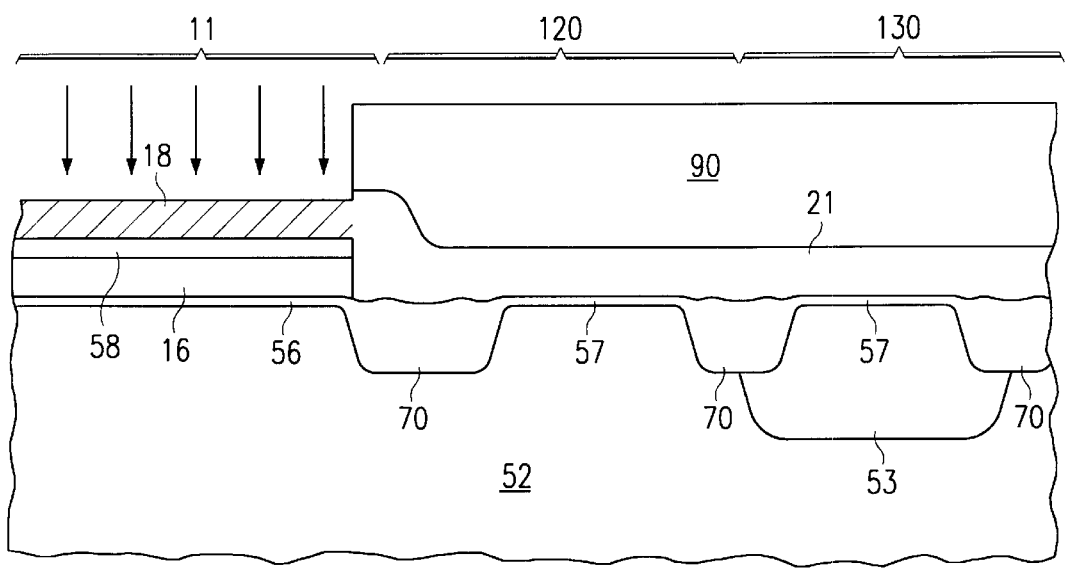

Illustrated in FIG. 5B is the structure of FIG. 5A after the formation and patterning of a photoresist layer 90 which will be used to mask the CMOS portion of the embedded memory circuit during processing. Following the patterning of resist layer 90, a n-type dopant species is implanted in the exposed polycrystalline silicon region over the first polycrystalline silicon layer 16. In an embodiment this n-type dopant species comprises phosphorous, arsenic or a combination of both. Following the implantation process, a partial polycrystalline silicon etch is performed. In an embodiment of the instant invention, the initial thickness of the polycrystalline silicon layer 21 is about 2500 A and the partial etch process removes about 500 A (ie., the partial etch will remove about 20% of the initial film thickness of the polycrystalline film). During this etching process, the portion of the film 21 in regions 120 and 130 where the CMOS transistors will be fabricated is protected by the resist film 90.

Figure 5C:
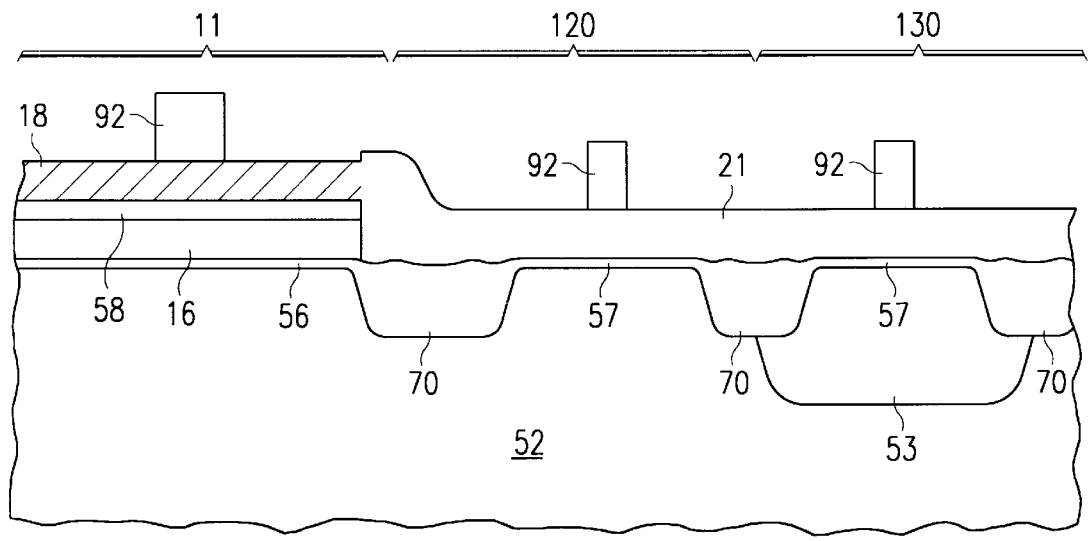
Figure 5D:
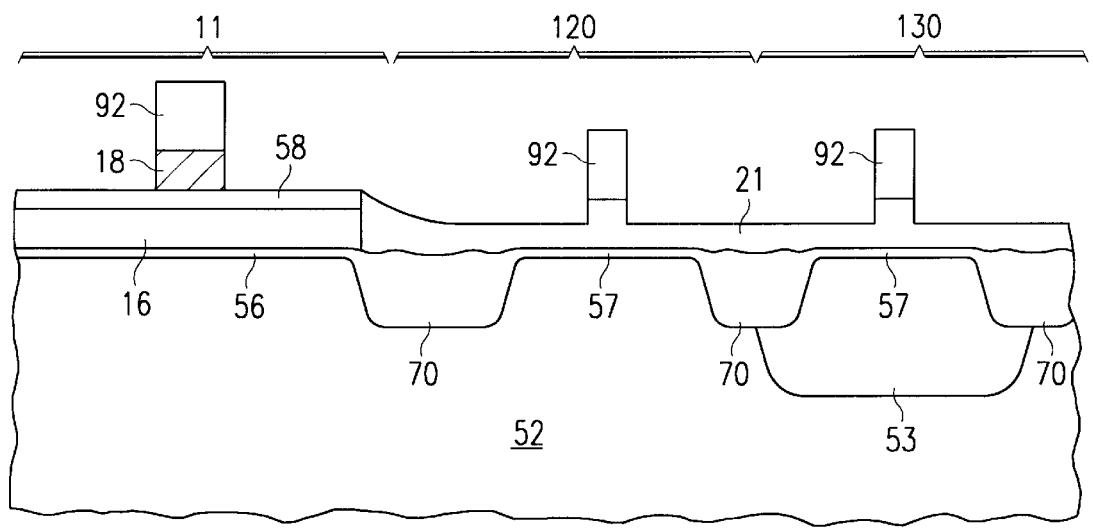

Illustrated in FIG. 5C is the structure of FIG. 5D following the removal of the resist film 90 and the formation of another patterned photoresist film 92. This patterned resist film 92 will be used to simultaneously form the gate stack for the FLASH cell and the gate electrodes for the NMOS and PMOS transistor.

Shown in FIG. 5D is the structure of FIG. 5C after a control gate polycrystalline silicon etch. This etch process forms the control gate of the FLASH cell and partially etches the gate structures for the NMOS and PMOS transistors. In an embodiment, this etch process comprises a plasma etch using HBr/Cl2/CF4/HeO2 with an optical emission endpoint. It should be noted that the doped portion of the film 21 would etch at a faster rate than the undoped portion of the film 21. In an embodiment where about 2000 A of the doped film is removed to form the FLASH cell control gate 18, substantially less than 2000 A of the film 21 will be removed in the regions 120 and 130.

Figure 5E:
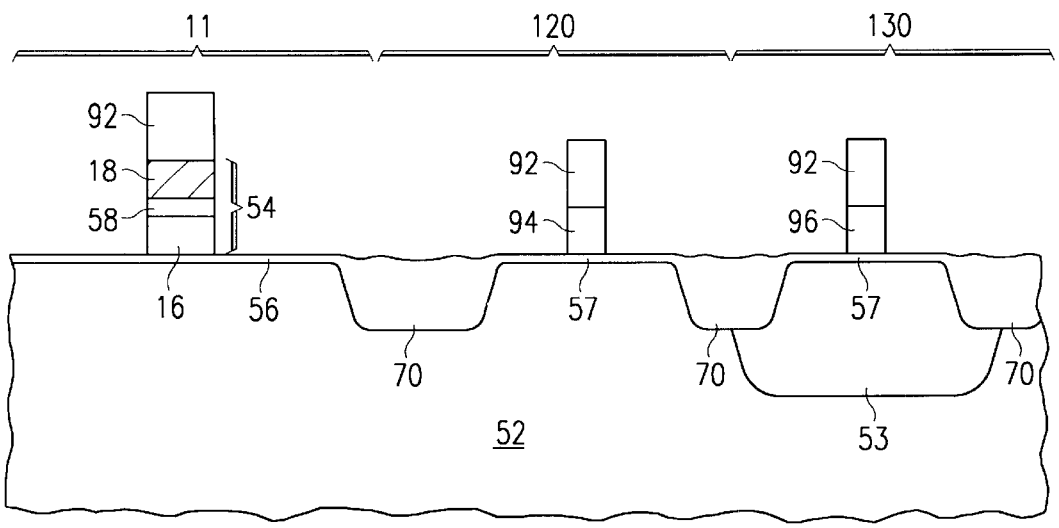

Shown in FIG. 5E is the structure of FIG. 5D after etching of the remaining film 21 to form the FLASH gate stack 54, the NMOS gate structure 94 and the PMOS gate structure 96. This stack and gate formation process comprises a multiple step etch process. The first step comprises an interpoly dielectric layer 58 etch. In an embodiment this is a plasma CHF3/O2 based etch with a high selectivity to polysilicon. This high selectivity ensures that enough polycrystalline silicon is left on the substrate surface to properly end point the etch step that removes the remaining polycrystalline silicon film to form the gate structures 94 and 96. Following the interpoly dielectric etch, a HBr/C12/HeO2 plasma based gate etch is used to remove the remaining polycrystalline silicon film to form the CMOS gates and form the floating gate the FLASH memory cell. This etch process uses optical emission or interferometer to end point the process. Following this etch a final over etch is performed to remove any remaining polycrystalline silicon stringers ( ie., very small region of polycrystalline silicon film attached to the various gate structures). In one embodiment, this over etch is a HBr/HeO2 based plasma etch which has a very high selectivity to silicon oxide. This over etch process can be used for up to a 100% over-etch without damaging the exposed silicon oxide films 56 and 57.

Figure 5F:
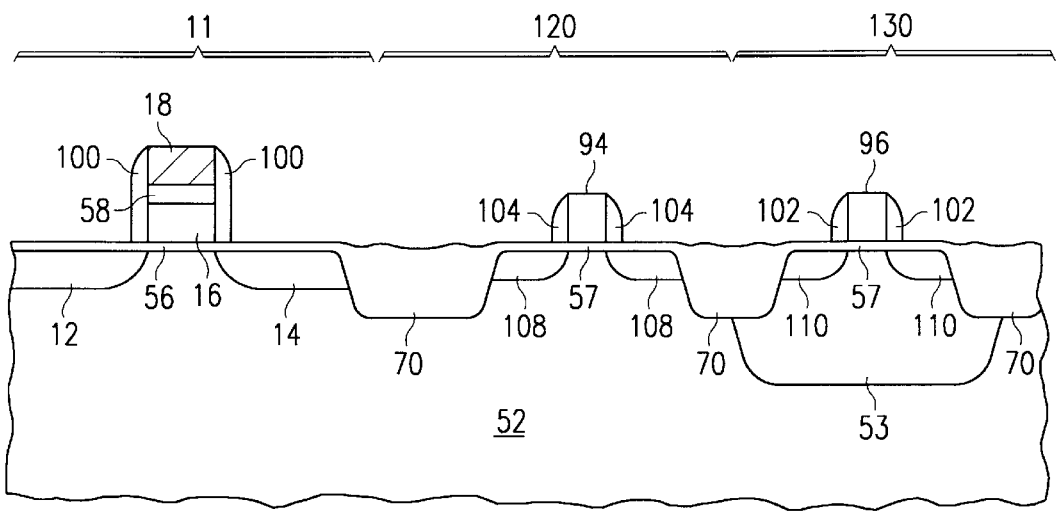

Following the simultaneous CMOS gate and FLASH stack formation process the embedded integrated circuit can be completed using standard processing techniques. Shown in FIG. 5F is a FLASH memory cell, a NMOS transistor, and a PMOS transistor. The sidewall structures for the various transistor structures 100, 102, and 104 comprise silicon nitride and are formed using standard techniques. The source and drain regions for the PMOS transistor 110 and the NMOS transistor are formed by implanting p-type dopant species and n-type dopant species respectively. The formation of the source region 12 and the drain region 14 of the FLASH cell is described above.

An advantage of the instant invention is the simultaneous formation of the transistor gate structures 94 and 96 and the FLASH gate stack 54 with a single masking step. While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of fabricating an embedded FLASH integrated circuit comprising:

forming a first photoresist film over a semiconductor substrate;

patterning said first photoresist film to expose a first region of a polycrystalline silicon film where a control gate will be formed in a FLASH memory cell and masking a second region of said polycrystalline silicon film wherein said second region of said polycrystalline silicon film region will be used to form a gate structure of a NMOS transistor and a gate structure of a PMOS transistor; and partially etching said first region of said polycrystalline silicon film.

2. The method of claim 1 wherein said partially etching said first region of said polycrystalline silicon film comprises removing about 20% of a initial film thickness of said polycrystalline silicon film.

3. The method of claim 1 wherein said partially etching said first region of said polycrystalline silicon film comprises using a $HBr/Cl_2/CF_4/HeO_2$ plasma etch process.

4. The method of claim 1 further comprising the steps of:

removing said first photoresist film;

forming and patterning a second photoresist film; and etching said polycrystalline silicon film to simultaneously form a FLASH memory cell gate stack structure, said gate structure of said NMOS transistor and said gate structure of said PMOS transistor.

5. A method of fabricating an embedded FLASH integrated circuit comprising:

forming a first photoresist film over a semiconductor substrate;

patterning said first photoresist film to expose a first region of a polycrystalline silicon film where a control gate will be formed in a FLASH memory cell and masking a second region of said polycrystalline silicon film wherein said second region of said polycrystalline silicon film region will be used to form a gate structure of a NMOS transistor and a gate structure of a PMOS transistor;

partially etching said first region of said polycrystalline silicon film;

removing said first photoresist film;

forming and patterning a second photoresist film; and etching said polycrystalline silicon film to simultaneously form a FLASH memory cell gate stack structure, said gate structure of said NMOS transistor and said gate structure of said PMOS transistor.

6. The method of claim 5 wherein said partially etching said first region of said polycrystalline silicon film comprises removing about 20% of a initial film thickness of said polycrystalline silicon film.

7. The method of claim 5 wherein said partially etching said first region of said polycrystalline silicon film comprises using a $HBr/Cl_2/CF_4/HeO_2$ plasma etch process.

8. A method of simultaneously forming FLASH memory cell gate stacks and NMOS and PMOS gate structures on an embedded integrated circuit comprising:

forming a first photoresist film over a semiconductor substrate;

patterning said first photoresist film to expose a first region of a polycrystalline silicon film where a control gate will be formed in a FLASH memory cell and masking a second region of said polycrystalline silicon film wherein said second region of said polycrystalline silicon film region will be used to form a gate structure of a NMOS transistor and a gate structure of a PMOS transistor;

implanting said first region of said polycrystalline silicon film with a n-type dopant species;

partially etching said first region of said polycrystalline silicon film;

removing said first photoresist film;

forming and patterning a second photoresist film; and etching said polycrystalline silicon film to simultaneously form a FLASH memory cell gate stack structure, said gate structure of said NMOS transistor and said gate structure of said PMOS transistor.

9. The method of claim 8 wherein said partially etching said first region of said polycrystalline silicon film comprises removing about 20% of a initial film thickness of said polycrystalline silicon film.

10. The method of claim 8 wherein said partially etching said first region of said polycrystalline silicon film comprises using a $HBr/Cl_2/CF_4/HeO_2$ plasma etch process.

11. The method of claim 8 wherein said etching said polycrystalline silicon film to simultaneously form a FLASH memory cell gate stack structure, said gate structure of said NMOS transistor and said gate structure of said PMOS transistor is a multiple step process, comprising:

a control gate etch comprising a $HBr/Cl_2/CF_4/HeO_2$ based plasma etch;

a $CHF_3/O_2$ based plasma interpoly dielectric etch;

a $HBr/Cl_2/HeO_2$ plasma based gate etch; and a $HBr/HeO_2$ based plasma over etch.

* * * * *